United States Patent
Zhou et al.

(10) Patent No.: US 9,305,782 B2
(45) Date of Patent: Apr. 5, 2016

(54) PITCH REDUCTION TECHNOLOGY USING ALTERNATING SPACER DEPOSITIONS DURING THE FORMATION OF A SEMICONDUCTOR DEVICE AND SYSTEMS INCLUDING SAME

(71) Applicant: Micron Technology, Inc., Boise, ID (US)

(72) Inventors: Baosuo Zhou, Boise, ID (US); Mirzafer K. Abatchev, Fremont, CA (US); Ardavan Niroomand, Boise, ID (US); Paul A. Morgan, Kuna, ID (US); Shuang Meng, Austin, TX (US); Joseph Neil Greely, Boise, ID (US); Brian J. Coppa, Tempe, AZ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/507,507

(22) Filed: Oct. 6, 2014

(65) Prior Publication Data

US 2015/0021744 A1 Jan. 22, 2015

Related U.S. Application Data

(62) Division of application No. 11/484,271, filed on Jul. 10, 2006, now Pat. No. 8,852,851.

(51) Int. Cl.
*H01L 21/033* (2006.01)
*H01L 23/00* (2006.01)
*H01L 21/308* (2006.01)

(52) U.S. Cl.
CPC ........ *H01L 21/0335* (2013.01); *H01L 21/0337* (2013.01); *H01L 21/0338* (2013.01);
(Continued)

(58) Field of Classification Search
CPC ............ H01L 21/0337; H01L 21/0338; H01L 21/3086; H01L 21/3088; H01L 21/0335
USPC ..................... 430/9, 311, 313; 257/E21.035, 257/E21.038, E21.039
See application file for complete search history.

(56) References Cited

U.S. PATENT DOCUMENTS

| 4,910,168 A | 3/1990 | Tsai |
| 5,008,207 A | 4/1991 | Blouse et al. |

(Continued)

FOREIGN PATENT DOCUMENTS

| CN | 1550889 | 12/2004 |
| CN | 1752844 | 3/2006 |

(Continued)

OTHER PUBLICATIONS

CN 200980148546.9 Srch Rpt, Nov. 23, 2012, Micron Technology, Inc.

(Continued)

*Primary Examiner* — Brittany Raymond
(74) *Attorney, Agent, or Firm* — Wells St. John P.S.

(57) ABSTRACT

A method for patterning a layer increases the density of features formed over an initial patterning layer using a series of self-aligned spacers. A layer to be etched is provided, then an initial sacrificial patterning layer, for example formed using optical lithography, is formed over the layer to be etched. Depending on the embodiment, the patterning layer may be trimmed, then a series of spacer layers formed and etched. The number of spacer layers and their target dimensions depends on the desired increase in feature density. An in-process semiconductor device and electronic system is also described.

10 Claims, 18 Drawing Sheets

(52) U.S. Cl.
CPC ........ *H01L21/3086* (2013.01); *H01L 21/3088* (2013.01); *H01L 23/564* (2013.01); *H01L 2924/0002* (2013.01)

(56) References Cited

U.S. PATENT DOCUMENTS

| | | |
|---|---|---|
| 5,013,680 A | 5/1991 | Lowrey et al. |
| 5,047,117 A | 9/1991 | Roberts |
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |
| 5,593,813 A | 1/1997 | Kim |
| 5,616,510 A | 4/1997 | Wong |
| 5,905,279 A | 5/1999 | Nitayama et al. |
| 5,916,821 A | 6/1999 | Kerber |
| 6,063,688 A | 5/2000 | Doyle et al. |
| 6,087,263 A | 7/2000 | Clampitt et al. |
| 6,140,217 A * | 10/2000 | Jones ................ H01L 21/76816 257/E21.575 |
| 6,174,818 B1 | 1/2001 | Tao et al. |
| 6,207,490 B1 | 3/2001 | Lee |
| 6,235,574 B1 | 5/2001 | Tobben et al. |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1 | 5/2002 | Subramanian et al. |
| 6,429,123 B1 | 8/2002 | Tseng |
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 * | 10/2003 | Chang et al. ..................... 216/46 |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lai et al. |
| 6,735,132 B2 | 5/2004 | Siek |
| 6,753,220 B2 | 6/2004 | Juengling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 6,977,404 B2 | 12/2005 | Katsumata et al. |
| 7,023,069 B2 | 4/2006 | Blanchard |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,074,533 B2 | 7/2006 | Fuller et al. |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,271,108 B2 | 9/2007 | Sadjadi |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,384,849 B2 | 6/2008 | Parekh et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,807,575 B2 | 10/2010 | Zhou |
| 7,842,601 B2 | 11/2010 | Lee et al. |
| 7,846,646 B2 | 12/2010 | Kamijima |
| 7,851,135 B2 | 12/2010 | Jung et al. |
| 7,855,038 B2 | 12/2010 | Hah et al. |
| 7,897,460 B2 | 3/2011 | Parekh et al. |
| 7,923,371 B2 | 4/2011 | Shinohe |
| 7,959,818 B2 | 6/2011 | Jung |
| 8,067,286 B2 | 11/2011 | Parekh et al. |
| 8,083,953 B2 | 12/2011 | Millward et al. |
| 8,083,958 B2 | 12/2011 | Li et al. |
| 8,148,052 B2 | 4/2012 | Vanleenhove et al. |
| 8,247,302 B2 | 8/2012 | Sills |
| 8,273,634 B2 | 9/2012 | Sills |
| 8,338,304 B2 | 12/2012 | Zhou |
| 8,440,576 B2 | 5/2013 | Hong |
| 8,575,032 B2 | 11/2013 | Light et al. |
| 8,629,048 B1 | 1/2014 | Sipani et al. |
| 8,629,527 B2 | 1/2014 | Parekh et al. |
| 8,796,155 B2 | 8/2014 | Sills et al. |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2002/0130348 A1 | 9/2002 | Tran |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Yoshida et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jim |
| 2005/0214683 A1 | 9/2005 | Nishimura et al. |
| 2005/0215040 A1 * | 9/2005 | Doyle ............................ 438/585 |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |

(56) References Cited

U.S. PATENT DOCUMENTS

| | | |
|---|---|---|
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1* | 2/2007 | Parascandola et al. ........ 438/733 |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0193658 A1 | 8/2008 | Millward |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0011374 A1 | 1/2009 | Chang et al. |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1 | 5/2009 | Yang et al. |
| 2009/0130852 A1 | 5/2009 | Kewley |
| 2009/0212016 A1 | 8/2009 | Cheng et al. |
| 2009/0214823 A1 | 8/2009 | Cheng et al. |
| 2009/0291397 A1 | 11/2009 | deVilliers |
| 2009/0298274 A1 | 12/2009 | Kajiware |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh |
| 2010/0081265 A1 | 4/2010 | Mashita et al. |
| 2010/0093175 A1 | 4/2010 | Niroomand et al. |
| 2010/0124826 A1 | 5/2010 | Millward et al. |
| 2010/0129980 A1 | 5/2010 | Sandhu et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |
| 2011/0147984 A1 | 6/2011 | Cheng et al. |
| 2013/0009283 A1 | 1/2013 | Zhou |
| 2013/0078574 A1 | 3/2013 | Peeters et al. |

FOREIGN PATENT DOCUMENTS

| | | |
|---|---|---|
| CN | 1761063 | 4/2006 |
| CN | 101026087 | 8/2007 |
| CN | 101145515 | 3/2008 |
| EP | 0171111 | 2/1986 |
| EP | 1273974.2 A2 | 1/2003 |
| JP | 56046531 | 4/1981 |
| JP | 58157135 | 9/1983 |
| JP | 59211231 | 11/1984 |
| JP | 64035916 | 7/1989 |
| JP | 1292829 | 11/1989 |
| JP | 3270227 | 12/1991 |
| JP | 199406077180 | 3/1994 |
| JP | 6275577 | 9/1994 |
| JP | 2002-217170 | 8/2002 |
| JP | 2003234279 | 8/2003 |
| JP | 2004134574 | 4/2004 |
| JP | 2004247399 | 9/2004 |
| JP | 2006245625 | 9/2006 |
| JP | 2007017993 | 1/2007 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| KR | 20080038963 | 5/2008 |
| TW | 200702903 | 1/2007 |
| TW | 200818405 | 4/2008 |
| TW | 200834660 | 8/2008 |
| TW | 098139942 | 12/2013 |
| WO | WO 2006/104654 | 10/2006 |

(56) References Cited

FOREIGN PATENT DOCUMENTS

| WO | WO 2007/027558 | 3/2007 |
|---|---|---|
| WO | WO 2008/008338 | 1/2008 |
| WO | WO2008/059440 | 5/2008 |

OTHER PUBLICATIONS

CN 200980148590.X Srch Rpt., Feb. 22, 2013, Micron Technology, Inc.
CN 201080013110.1 Srch Rpt., May 9, 2013, Micron Technology, Inc.
CN200980148548.8 Search Report, Feb. 18, 2013, Micron Technology, Inc.
EP 09743197 Supp. Partial SR, Jun. 18, 2013, Micron Technology, Inc.
EP 09830818.2 Supp. Srch Rpt., Jul. 30, 2013, Micron Technology, Inc.
EP 09830819.0 Supp. Srch. Rpt., Mar. 21, 2013, Mircron Technology, Inc.
EP 09830820.8 Supp. Srch Rpt., Aug. 13, 2013, Micron Technology, Inc.
EP 10756541.8 Supp. Srch Rpt., May 27, 2013, Micron Technology, Inc.
PCT/US2007/015729 IPRP, Jan. 13, 2009, Micron Technology, Inc.
PCT/US2007/015729 Srch Rpt., Jan. 2, 2008, Micron Technology, Inc.
PCT/US2007/015729 Wtn. Opin., Jan. 2, 2008, Micron Technology, Inc.
PCT/US2009/039793 IPRP, Nov. 9, 2010, Micron Technology, Inc.
PCT/US2009/039793 Srch Rpt., Oct. 30, 2009, Micron Technology, Inc.
PCT/US2009/039793 Wtn. Opn., Oct. 30, 2009, Micron Technology, Inc.
PCT/US2009/041500 IPRP, Dec. 2, 2010, Micron Technology, Inc.
PCT/US2009/041500 Srch Rpt., Dec. 7, 2009, Micron Technology, Inc.
PCT/US2009/041500 Wtn. Opn., Dec. 7, 2009, Micron Technology, Inc.
PCT/US2009/063978 IPRP, Jun. 7, 2011, Micron Technology, Inc.
PCT/US2009/003978 Srch Rpt., May 31, 2010, Micron Technology, Inc.
PCT/US2009/063978 Wtn. Opn., May 31, 2010, Micron Technology, Inc.
PCT/US2009/063999 IPRP, Jun. 7, 2011, Micron Technology, Inc.
PCT/US2009/063999 Srch Rpt., May 31, 2010, Micron Technology, Inc.
PCT/US2009/063999 Wtn. Opn., May 31, 2010, Micron Technology, Inc.
PCT/US2009/064004 IPRP, Jun. 16, 2011, Micron Technology, Inc.
PCT/US2009/064004 Srch. Rpt., May 31, 2010, Micron Technology, Inc.
PCT/US2009/064004 Wtn. Opn., May 31, 2010, Micron Technology, Inc.
PCT/US2010/025495 IPRP, Sep. 27, 2011, Micron Technology, Inc.
PCT/US2010/025495 Srch Rpt, Sep. 29, 2010, Micron Technology, Inc.
PCT/US2010/025495 Wtn. Opn., Sep. 29, 2010, Micron Technology, Inc.
PCT/US2010/055488 IPRP, Jun. 5, 2012, Micron Technology, Inc.
PCT/US2010/055488 Srch. Rpt, Jun. 27, 2011, Micron Technology, Inc.
PCT/US2010/055488 Wtn Opinion, Jun. 27, 2011, Micron Technology Inc.
SG 201300853-7 Search Rep., Jun. 10, 2013, Micron Technology, Inc.
SG 201300853-7 Written Op., Jun. 11, 2013, Micron Technology, Inc.
TW 098113229 Search Report, Sep. 26, 2012, Micron Technology, Inc.
TW 098139941 Srch Rpt., Dec. 18, 2012, Micron Technology, Inc.
TW 098139943 Search Report, Dec. 21, 2012, Micron Technology, Inc.
TW 099140232 Srch Rpt. Trans, Jul. 29, 2013, Micron Technology, Inc.
Clariant Polysilazane SOD Spinful 400 Series for STI/PMD Application; At least as early as Oct. 19, 2009; 1 p.
Ee et al., "Innovative Solutions to Enhance the Legacy Equipments Towards "One Generation ahead" in Flip chip BGA 0.8mm Ball Technology", 2005, IEEE, pp. 331-334.
Fritze et al., "Enhanced Resolution for Future Fabrication", IEEE Circuits & Devices Magazine, Jan. 2003, pp. 43-47.
Gallia et al., "A Flexible Gate Array Architecture for High-Speed and High-Density Applications", IEEE Journal of Solid-State Circuits, vol. 31, No. 3, Mar. 1996, pp. 430-436.
Hori et al., "Sub-40nm Half-Pitch Double Patterning with Resist Freezing Process", Advances in Resist Materials and Processing Technology XXV, Proc. of SPIE, vol. 6923, 2008, 8 pages.
Lee et al., "Double-Patterning Technique Using Plasma Treatment of Photoresist", Japanese Journal Applied Physics, vol. 46, No. 9B, 2007, pp. 6135-6139.
Liau et al., "Softbake and Post-exposure Bake Optimization for Process Window Improvement and Optical Proximity Effect Tuning" ICSE2006 Proc. 2006, 7 pages.
Lu, "Advanced Cell Structures for Dynamic RAMs", IEEE Circuits and Devices Magazine, Jan. 1989, pp. 27-36.
Ma, "Plasma Resist Image Stabilization Technique (PRIST)", 1980 IEEE, pp. 574-575.
Owa et al., "Immersion Lithography for 45 nm Manufacgturing and Beyond", SEMI Advanced Semiconductor Manufacturing Conference, 2007 IEEE, pp. 238-244.
Pease et al., "Lithography and Other Patterning Techniques for Future Electronics", Proceedings of the IEEE, 2008, vol. 96, No. 2, Feb. 2008, pp. 248-256.
Tan et al., "Current Status of Nanonex Nanoimprint Solutions", website: www.nanonex.com/technology.htm 2004, 9 pgs.
Terai et al. "Newly developed RELACS process and materials for 65nm node device and beyond", website: ieeexplore.ieee.org/iel5/10631/33565/01595193.pdf, pp. 20-21.
Toyoshima et al.; 0.1 μm Level Contact Hole Pattern Formation with KrF lithography by Resolution Enhancement Lithography Assistedby Chemical Shrink (RELACS); IEEE; 1998; pp. 12.5.1-12.5.4.

* cited by examiner

PITCH REDUCTION TECHNOLOGY USING ALTERNATING SPACER DEPOSITIONS DURING THE FORMATION OF A SEMICONDUCTOR DEVICE AND SYSTEMS INCLUDING SAME

RELATED PATENT DATA

This patent is a divisional of U.S. patent application Ser. No. 11/484,271 filed Jul. 10, 2006, entitled "Pitch Reduction Technology Using Alternating Spacer Depositions During the Formation of a Semiconductor Device and Systems Including Same", the entirety of which is incorporated by reference herein.

FIELD OF THE INVENTION

This invention relates to the field of semiconductor manufacture and, more particularly, to a method for forming features at a starting feature density with a lithography mask, and resulting in a final density which is n times of the first density, where n is an integer greater than 1, through the use of various conformal layers and selective etches.

BACKGROUND OF THE INVENTION

During the formation of a semiconductor device, many features such as word lines, digit lines, contacts, and other features are commonly formed over a semiconductor wafer. A goal of semiconductor device engineers is to form as many of these features in a given area as possible to increase yields, decrease manufacturing costs, and to miniaturize devices. The formation of these structures on a semiconductor wafer typically requires the use of lithography. Optical lithography, the lithographic method most used in leading-edge wafer processing, comprises projecting coherent light of a given wavelength, typically 248 nanometers (nm) or 193 nm, from an illumination source (illuminator) through a quartz photomask or reticle having a chrome pattern representative of features to be formed, and imaging that pattern onto a wafer coated with photoresist. The light chemically alters the photoresist and enables the exposed photoresist (if positive resist is used) or the unexposed photoresist (if negative resist is used) to be rinsed away using a developer.

With decreasing feature sizes, the limits of optical lithography are continually being tested. Improvements in feature density are made through process advances, enhanced lithographic methods referred to as resolution enhancement techniques, and improved equipment and materials.

One such process advance, depicted in FIGS. 1-6, uses a mask having repeating features of a given pitch (i.e. a given distance from the beginning of one repeating feature to the beginning of the next feature) along with the formation of various layers and selective etches to double the density of the features formed from the lithography mask. FIG. 1 depicts a semiconductor wafer substrate assembly 10 comprising a semiconductor wafer, a layer to be etched 12, for example a silicon nitride layer, a support layer 14, for example formed from carbon using chemical vapor deposition (CVD) or a spin-on technique, and a patterned masking layer 16, such as a photoresist layer formed using an optical lithographic process or a hard mask layer formed using optical lithography and an etch process. The patterned masking layer 16 may be formed at the feature size limits allowed by the lithographic process, and comprises three individual features (three periods/pitches) formed over a given distance 18.

After forming the structure of FIG. 1, an etch of the support layer 14 is performed using mask 16 as a pattern. This etch is typically an anisotropic dry etch which etches the support layer 14 selective to the layer to be etched 12 (i.e. which removes the support layer 14 with little or no etching of the layer to be etched 12). After etching the support layer 14, the patterned masking layer 16 is removed and a conformal hard mask layer 20, for example silicon dioxide, is formed to result in the structure of FIG. 2.

Subsequently, a spacer etch of the FIG. 2 structure is performed to result in the structure of FIG. 3 having spacers 20' from the hard mask layer along sidewalls of the support layer 14. Subsequently, the support layer 14 is etched to result in the structure of FIG. 4.

Next, spacers 20' formed from the hard mask layer are used as a pattern to etch the layer to be etched 12, which results in the structure of FIG. 5. Finally, spacers 20' are etched selective to the layer to be etched 12 to result in the structure of FIG. 6.

The process of FIGS. 1-6 has the advantage of using optical lithography to form the masking layer 16 having three features in a given distance 18, while the completed structure depicted in FIG. 6 has six features 12 (six periods/pitches) in the original distance 18. Thus the number of features within the distance is approximately doubled without requiring an additional lithography mask.

Various techniques to increase feature density are described in U.S. Pat. No. 5,328,810 by Tyler A. Lowrey, et al. and U.S. Pat. No. 5,254,218 by Ceredig Roberts et al., both of which are assigned to Micron Technology, Inc. and incorporated herein as if set forth in their entirety.

A method for forming a semiconductor device using an optical lithography mask with a first pitch and resulting in features having a second pitch equal to 1/n, where n is an integer greater than 1 and without limitation of feature size reduction or spacing to one-half of that attainable using lithography, would be desirable.

Figure 1:
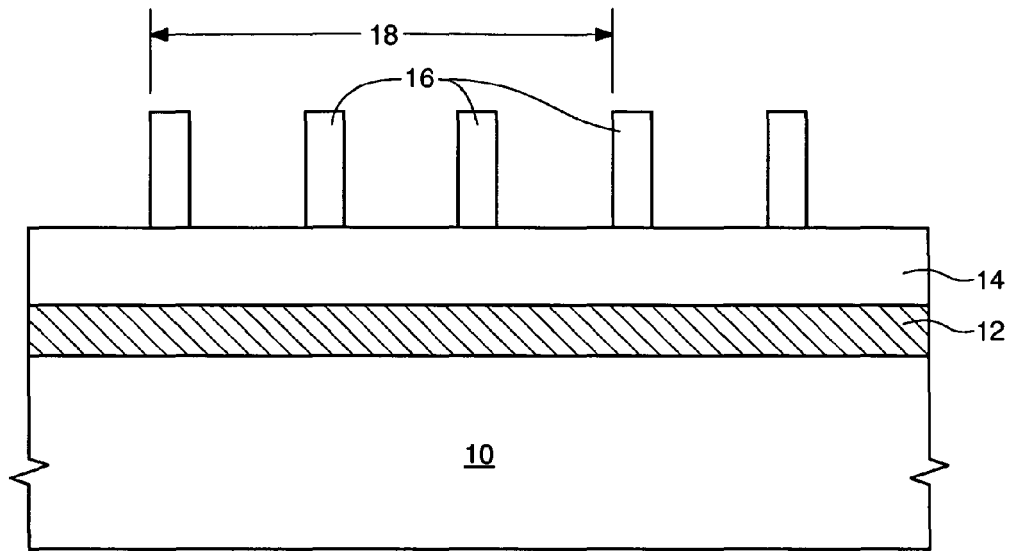
FIGS. 1-6 are cross sections depicting a conventional process for doubling the number of mask features, for example formed using photolithography.
Figure 2:
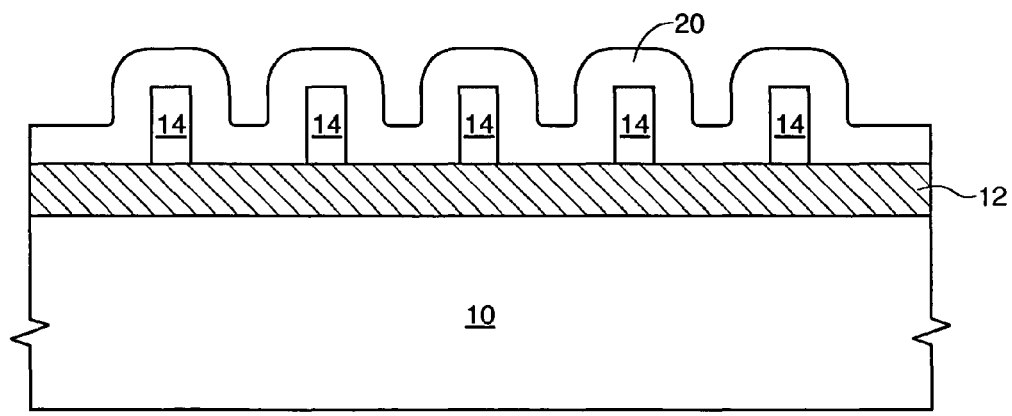
Figure 3:
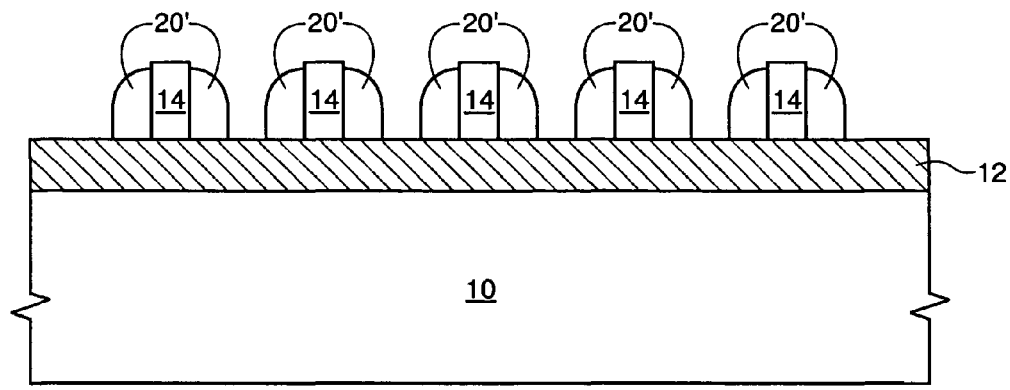
Figure 4:
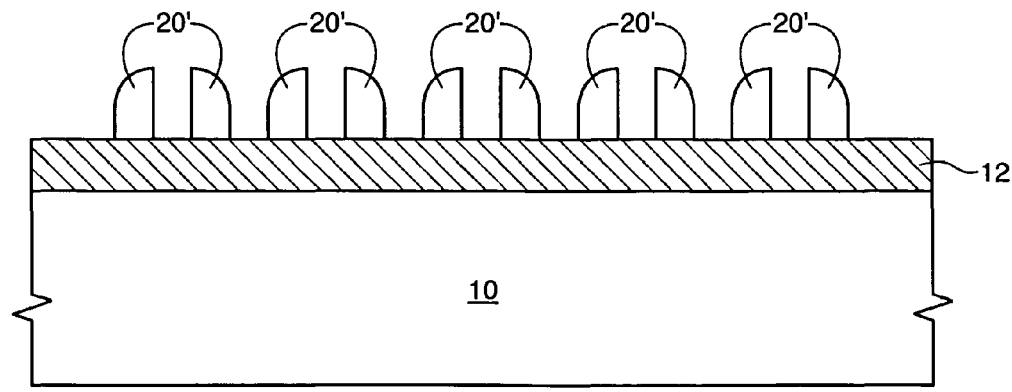
Figure 5:
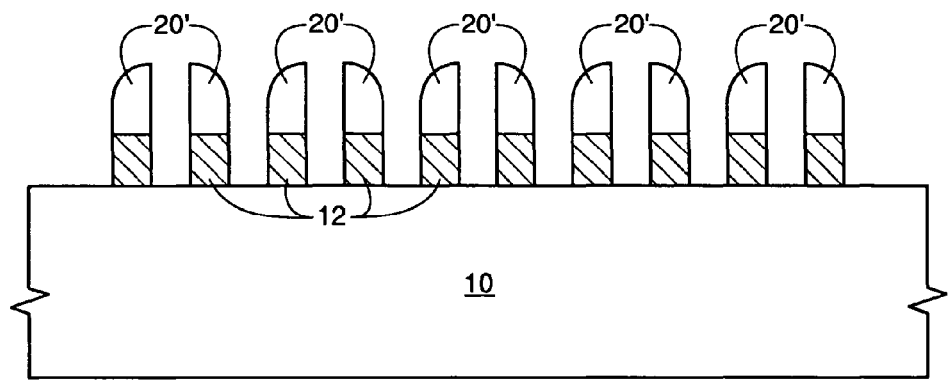
Figure 6:
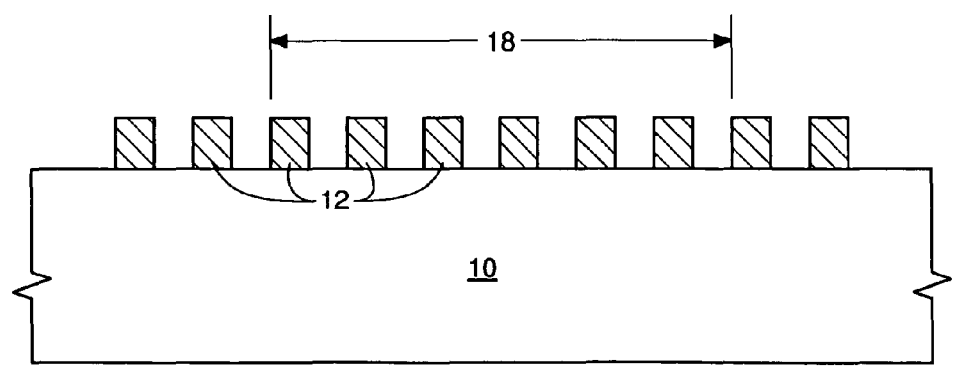

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein. The term "about" indicates that the value listed may be somewhat altered, as long as the alteration does not result in nonconformance of the process or structure in question to the present invention. A "spacer" indicates a layer, typically dielectric, formed as a conformal layer over uneven topography then anisotropically etched to remove horizontal portions of the layer and leave taller, vertical portions of the layer.

Various embodiments of the present invention use alternating spacer deposition (ASD) for pitch reduction to achieve variable critical dimension (CD) reduction ratios. The pitch reduction process achieves a CD which is smaller than that defined by a previously formed photolithography mask. The various process embodiments described herein comprise the use of a first type of spacer material used as a sacrificial layer and removed with high selectivity to a second spacer material which is used to pattern an underlying layer. Depending upon the trim ratio, the number of spacer depositions, and the thickness of each deposition, a CD which is 1/n of the original value defined by prior photolithography may be achieved, where n is an odd or even integer greater than 1. In other words, the process multiplies the pattern density by n times. Particularly, by repeating the ASD process followed by a corresponding spacer etch m times, a CD may be achieved which is either 1/2m or 1/(2m-1) of the starting CD, depending upon which of two methodologies is performed.

A first embodiment of an inventive method for forming a semiconductor device is depicted in FIGS. 7-14. This process embodiment results in a CD which is reduced to 1/2m of its original value. The value of m may be determined by totaling the number of spacer layers formed during the ASD process.

Figure 7:
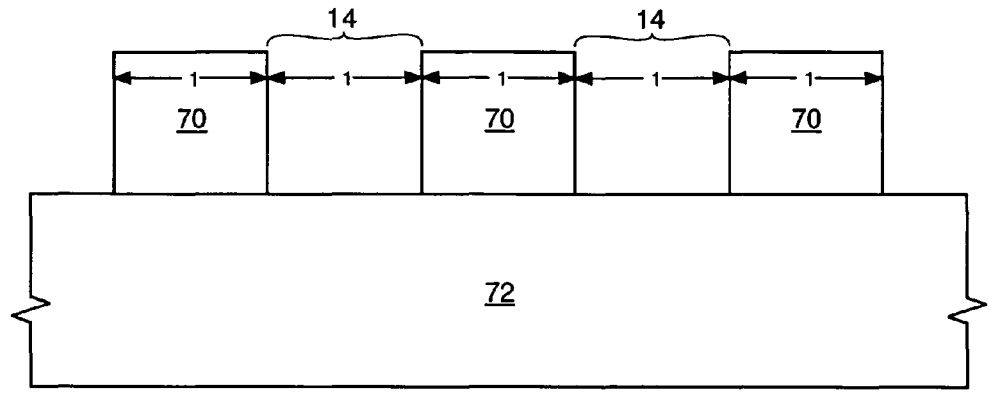
FIGS. 7-15 are cross sections of an in-process semiconductor device depicting an embodiment of the inventive method which increases the number of features in a given area by four times.

FIG. 7 depicts a sacrificial photolithographic pattern 70, for example comprising segmented sections of photoresist having cross sectional sidewalls, overlying a layer to be etched 72. The layer to be etched 72 may be a semiconductor wafer, a semiconductor wafer substrate assembly comprising one or more layers overlying a semiconductor wafer or wafer section, or one or more other layers which are to be subjected to a patterning etch. In this embodiment, the photolithographic features 70 are formed at the lithographic limits, with the width of each feature 70 and the spacing 14 between the features 70 all being about equal. Layer 70 may comprise a patterned material other than photoresist.

Figure 8:
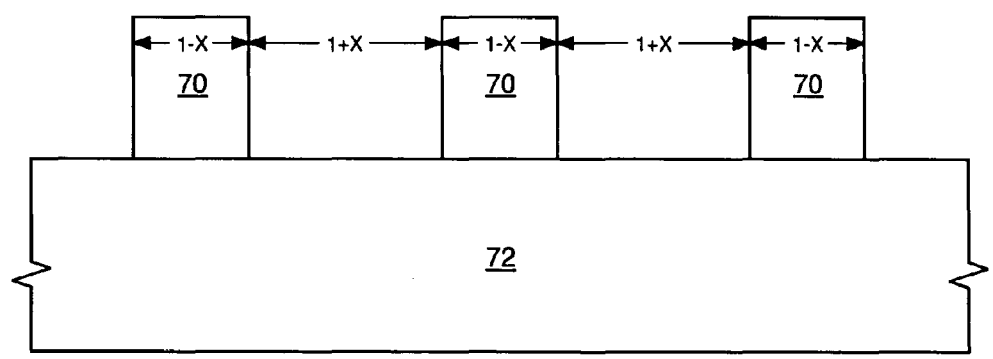

After forming the FIG. 7, structure a trim is performed on the photoresist using an isotropic etch to result in the structure of FIG. 8. When using photoresist as layer 70, the trim may be performed by exposing mask 70 to an oxygen-based plasma such as an $O_2/Cl_2$ plasma or an $O_2/HBr$ plasma. In this embodiment, the trim of the photoresist layer 70 is targeted to narrow the width of each feature 70 by 0.25 (25%). That is, after trimming, the width of each feature is narrowed by about 25% from the width of the pretrimmed feature. In an alternative to performing a trim for this and other embodiments specifying a trim process, the photoresist features 70 may be instead printed directly according to the dimensions of FIG. 8 if the lithographic process is sufficiently relaxed to allow the patterning directly without a trim. The completed mask is targeted to have four times the density of the original pattern, with the original pattern being the untrimmed photoresist layer 70 at FIG. 7. As the target is to form a pattern density which is four times the original pattern (i.e. to have a pitch which is ¼ of the original), the number of required spacer layers indicated by 1/2m is 2.

Figure 9:
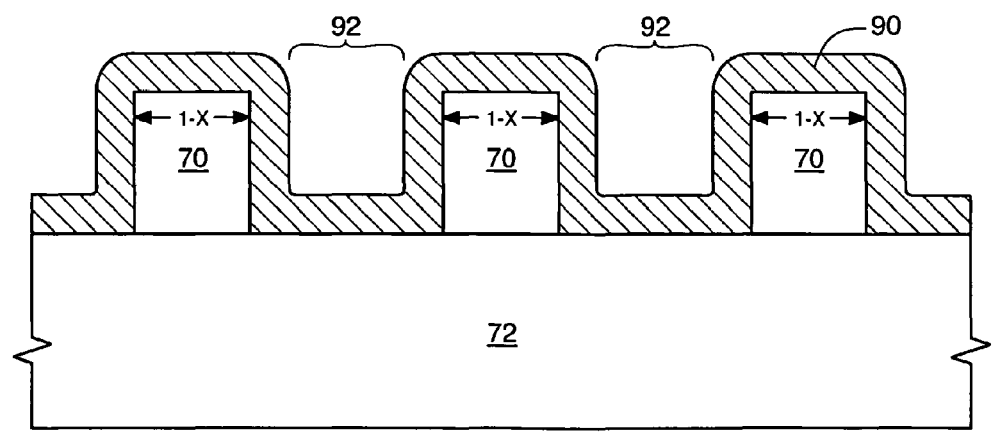
Figure 10:
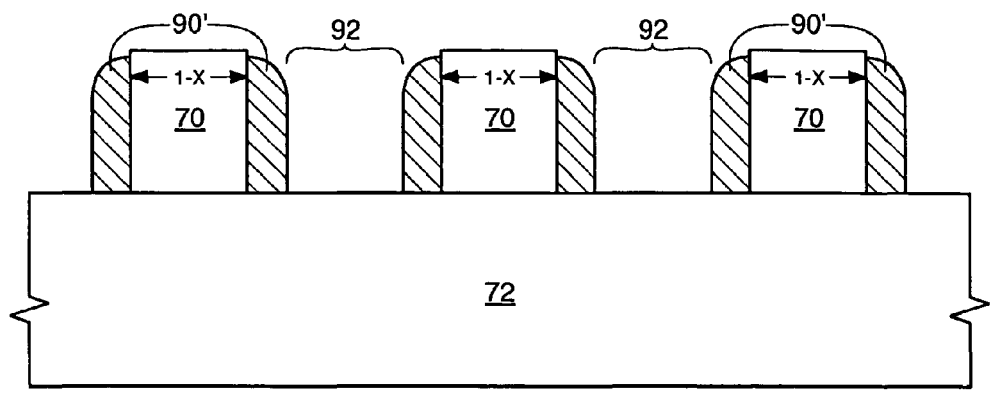

Next, a first spacer layer 90, such as silicon dioxide, is deposited over the surface of the FIG. 8 structure to result in the structure of FIG. 9. The thickness of first spacer layer 90 is targeted to be 0.25 times the width of original pattern 70 of FIG. 7. With FIG. 9, distance 92 is the same as the width of each trimmed photoresist feature 70. A spacer etch is performed on first spacer layer 90 of FIG. 9 using conventional technology to result in the FIG. 10 structure having first spacers 90'.

Figure 11:
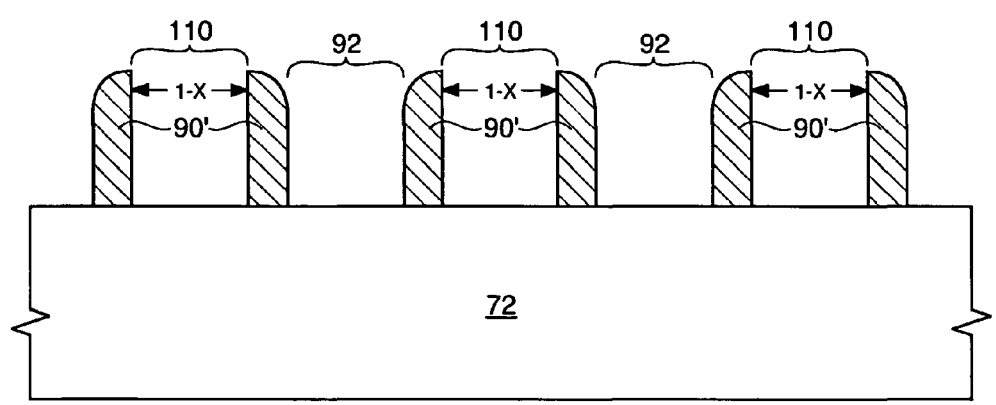

After the spacer etch of first spacer layer 90 to form spacers 90', the photoresist layer 70 is removed, for example using an ashing process followed by a wafer clean to result in the FIG. 11 structure. As this process removes very little or none of the first spacers 90', the spacing at 110 and at 92 does not change significantly.

Figure 12:
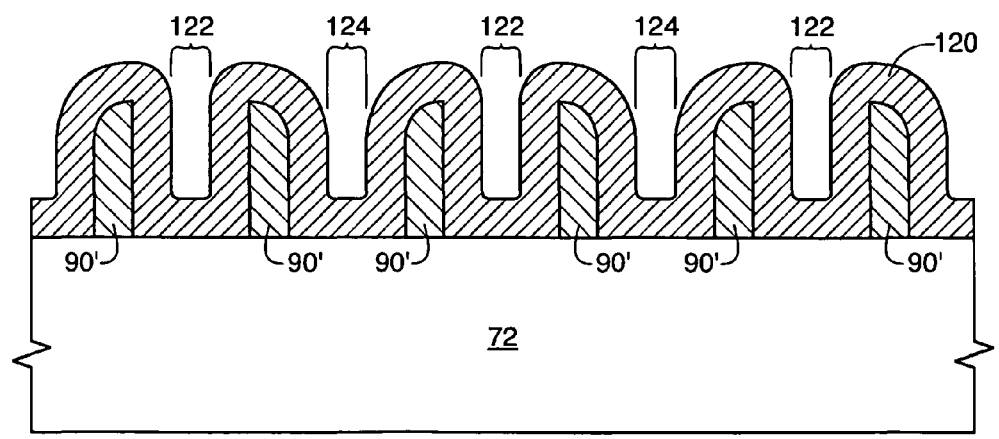

Next, a second spacer layer 120 is formed over the FIG. 11 structure to result in the FIG. 12 structure. The material of second spacer layer 120 is selected such that first spacers 90' may be removed selective to layer 120 (i.e. spacer layer 90' may be removed with little or no etching of layer 120). In this embodiment, second spacer layer 120 comprises silicon nitride. This layer 120 is also targeted to a thickness equal to 0.25 times the thickness of the original untrimmed photoresist features. As spacing 110 and 92 of FIG. 11 are about equal, spacing 122 and 124 of FIG. 12 are also about equal.

Figure 13:
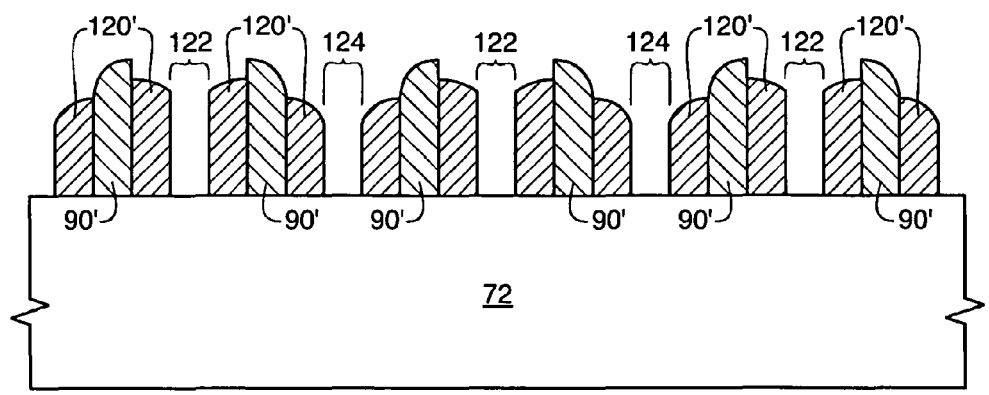

After forming the FIG. 12 structure, an etch such as a spacer (anisotropic) etch is performed on the second spacer layer 120 to result in the structure of FIG. 13 having second spacers 120'. First spacers 90' are then removed selective to second spacers 120' to result in the FIG. 14 structure. Silicon dioxide may be removed selective to silicon nitride using a wet process such as buffered hydrofluoric acid (HF) or a dry etch process known in the art. In this embodiment, the pattern formed by remaining second spacers 120' has a density which is four times that of the original layer 70 at FIG. 7 (i.e. the pitch is 0.25 times that of the pitch of the features of FIG. 7). The particular etch used to remove first spacers 90' selective to second spacers 120' depends on the material used for each layer, and may be any suitable etch known in the art. Finally, the layer to be etched 72 is etched using the spacers 120' as a pattern to form features from the layer to be etched 72. Any etchant may be used which removes layer 72 with reasonable selectivity to spacers 120' and results in a completed structure similar to that of FIG. 15.

For this embodiment, the sizes of various elements related to the pattern formed may be described in mathematical terms. Referring to FIG. 7, each sacrificial photoresist feature 70 is formed to an arbitrary width of 1, with the distance 14 between each feature 70 also being 1; thus, the pitch is 2. Each photoresist feature 70 is trimmed by X to result in the structure of FIG. 8. Thus each feature 70 has a width of 1−X, and the distance 14 between each feature is 1+X. In this embodiment, where each feature 70 has a width of 1, X is equal to 0.25 (i.e. 25% of the width of feature 70). Next, the first spacer layer 90 is formed to have a thickness of "a," so that distance 92 equals 1+X−2am, where m is the number of spacer layers formed thus far in the process (i.e. 1). In this embodiment, and in other embodiments which reduce the CD to 1/2m of the starting CD, "a" (the thickness of first spacer layer 90) is targeted to be equal to X (the width trimmed from each feature 70). The etch of first spacer layer 90 to result in the FIG. 10 structure does not change the relationship between elements 70 or 90. The removal of photoresist features 70 to result in FIG. 11 forms opening 110 having a width of 1−X (0.75), which was the post-trimmed width of photoresist feature 70, and a distance 92 of 1+X−2am. (Since "a" equals X and m equals 1 at this point, 1−X=1+X−2am so the two distances 110 and 92 are equal, not counting any process-induced variations.) At FIG. 12, the second spacer layer 120 is formed to have a thickness of "a" (again, with this embodiment, "a" is equal to X). Thus distance 122 is equal to 1−X−2a(m−1) where m is the number of spacer layers formed thus far (i.e. 2). Next, the second spacer layer 120 is etched to result in the FIG. 13 structure, and the first spacer layer 90 is removed to result in the structure of FIG. 14.

Figure 14:
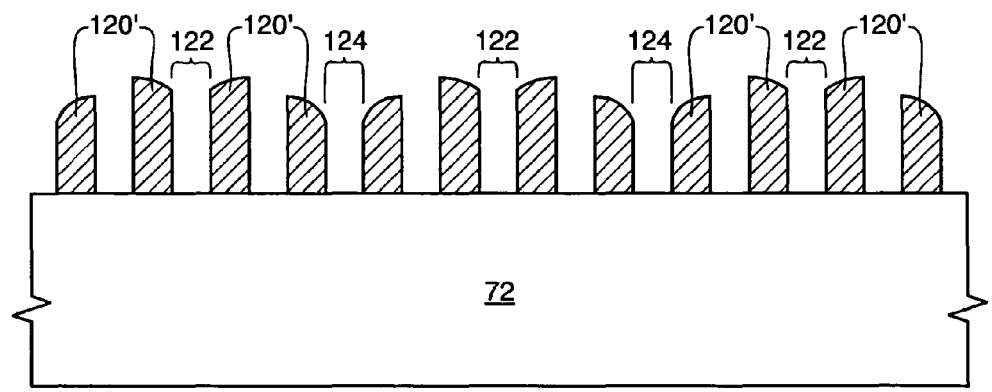
Figure 15:
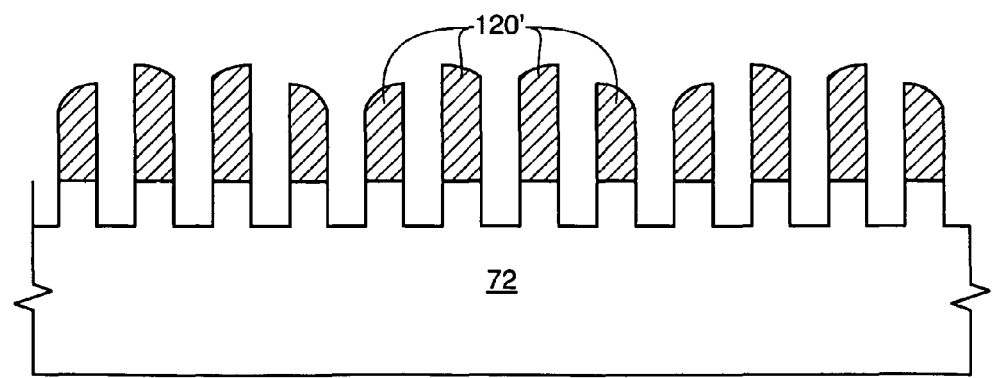

With the original (pretrimmed) width of photoresist 70 at FIG. 7 being equal to 1, the distance between each feature in FIG. 14 is equal to 0.25. As described in the paragraph above, distance 122 is equal to 1−X−2a(m−1) where, for this embodiment, X=a=0.25 and m=2 (the number of spacer layers). Thus it may be determined that distance 122 is equal to 1−0.25−2(2−1)0.25=0.25. Further, distance 124 is equal to 1+X−2am, thus it may be determined that distance 124 is equal to 1+0.25−2(0.25)(2)=0.25. In general terms, "a", the first and second spacer layer thickness, is equal to X (the amount of trim), and also equal to 1/2m (the final CD, where "m" equals the number of spacer layers).

It is contemplated that the process described above may be modified for higher values of m in the expression 1/2m, which will increase the feature density by multiples of 2. A process where m=3 is depicted in FIGS. 7 and 16-22, which decreases the feature pitch by ⅙ (i.e. the feature density is increased by six times). Again, for simplicity of explanation, the width of the photoresist is initially targeted to an arbitrary thickness of 1, with a distance between the photoresist of 1. The photoresist features, therefore, have a pitch of 2, which is depicted in FIG. 7. After forming the FIG. 7 structure, each photoresist feature 70 is trimmed by ⅙ of its width (i.e. X=⅙). Thus the distance between photoresist features 70 increases to 7/6.

Figure 16:
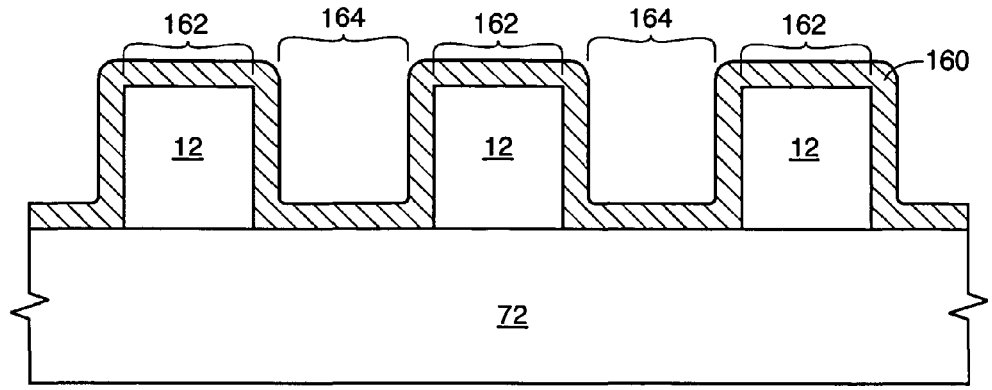
FIGS. 16-22 are cross sections depicting an embodiment of the inventive method which increases the number of features in a given area by six times.
Figure 17:
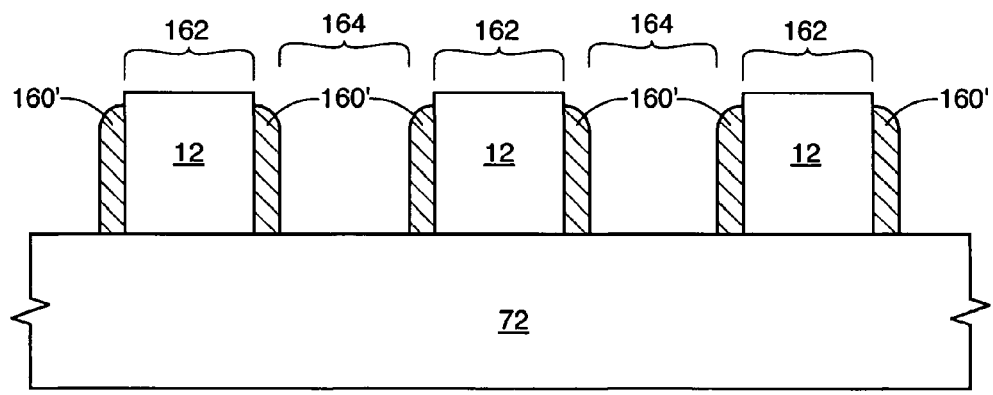

Next, a blanket first spacer layer 160, for example silicon nitride, is formed over the trimmed photoresist as depicted in FIG. 16. The thickness of the first spacer layer 160 is targeted to a thickness of ⅙. In FIG. 16, photoresist 70 has a width 162 of ⅚, and distance 164 is also equal to ⅚. The first spacer layer 160 is spacer etched to result in the first spacers 160' as depicted in FIG. 17. The base width of each spacer 160' is targeted to remain at ⅙. Spacer layer 160 represents m=1, being the first spacer layer.

Figure 18:
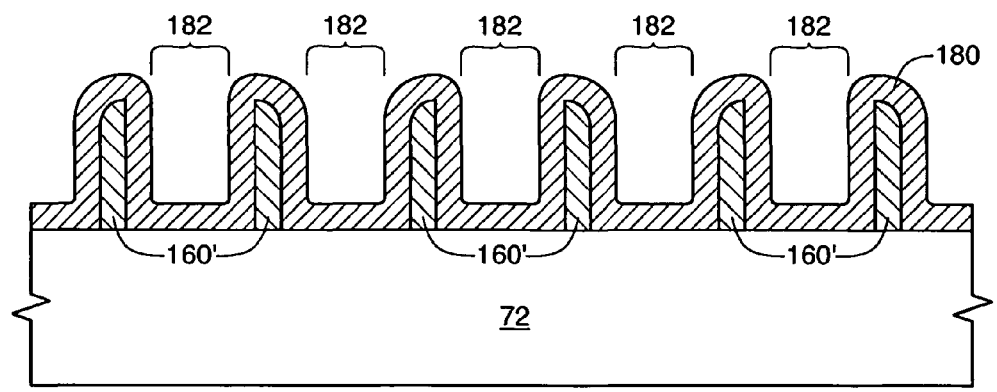
Figure 19:
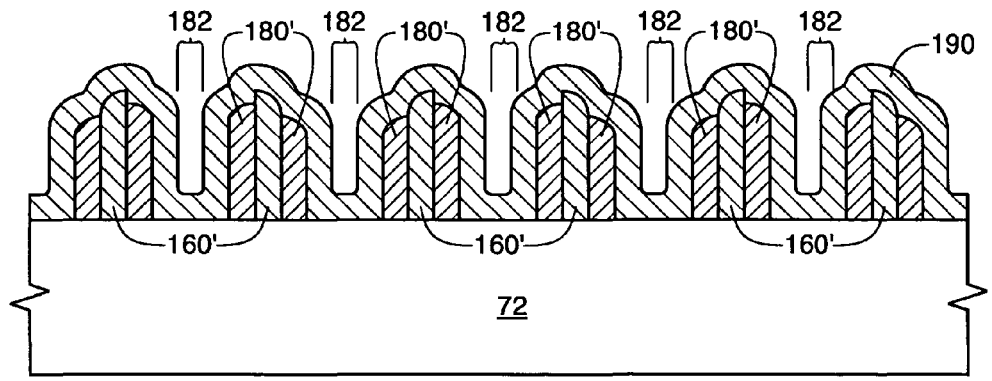

After forming the FIG. 17 structure, the photoresist 70 is removed and a blanket second spacer layer 180 is formed over the first spacers 160' as depicted in FIG. 18. Spacer layer 180 represents m=2, being the second spacer layer. The second spacer layer 180 is formed from a material which may be etched selective to first spacers 160', for example silicon dioxide. The second spacer layer 180 is targeted to a thickness of ⅙, thus distance 182 is equal to 3/6 (i.e. X/2). The FIG. 18 structure is subjected to a spacer etch of layer 180 to form second spacers 180' as depicted in FIG. 19, then a blanket third spacer layer 190 is formed as depicted. The third spacer layer 190 may be formed from the same material as the first spacer layer, for example silicon nitride, and is targeted for a thickness of ⅙. Thus distance 192 is ⅙. Spacer layer 190 represents m=3, the final spacer layer in 1/2m where m=3.

Figure 20:
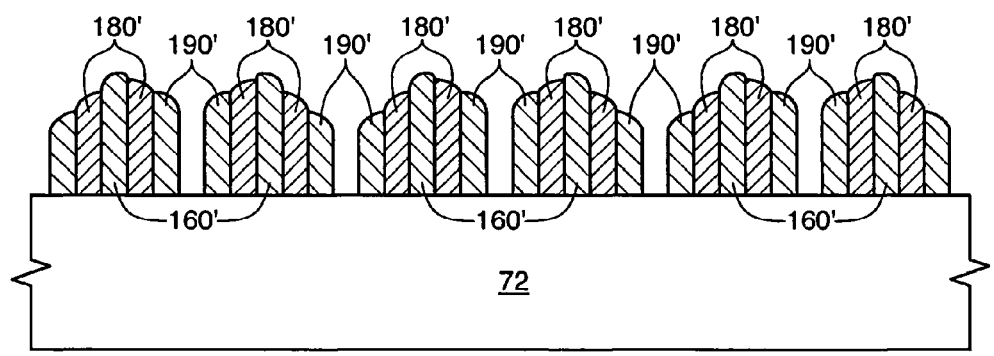
Figure 21:
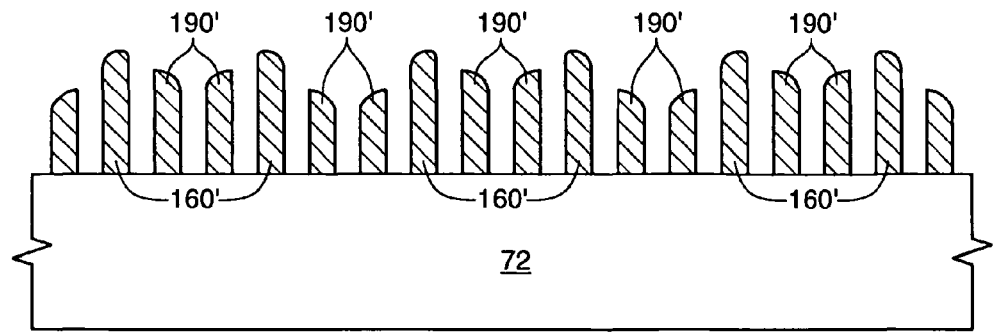
Figure 22:
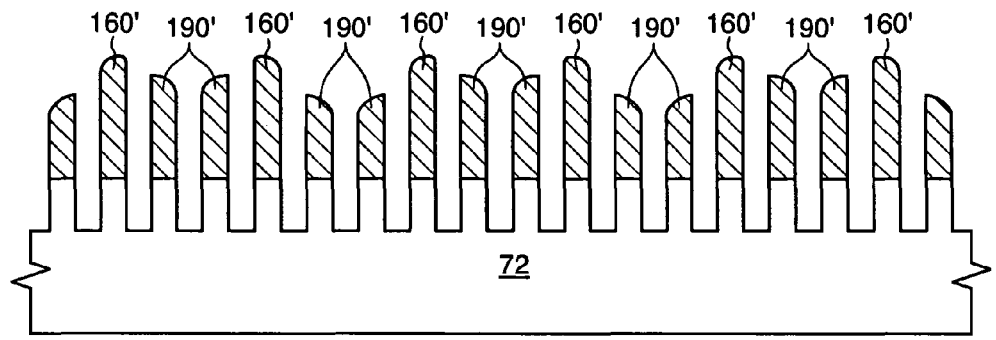

A spacer etch of layer 190 is performed to result in the structure of FIG. 20 comprising spacers 160', 180', and 190', then the second spacers 180' are etched and removed selective to the first spacers 160' and to the third spacers 190'. After the etch of the silicon dioxide second spacers 180' selective to silicon nitride spacers 160' and 190', the structure of FIG. 21 remains. The spacers 160', 190' provide a mask having a density which is six times the density of the photoresist layer 70 of FIG. 7. Finally, the layer to be etched 72 is etched using spacers 160', 190' as a mask to result in the structure of FIG. 22.

This process may be modified from the description herein for any value of m. The practical limit to the maximum value of m depends on the processing technology and the starting dimensions of X (the width of the photoresist and the distance between the photoresist) at FIG. 7.

For a total spacer deposition of m times, the spacers obtained from (m−1)th, (m−3)th, (m−5)th, etc. depositions are sacrificial and may be selectively removed. For the embodiment of FIGS. 16-22 where m=3, the m−1 spacers, i.e. the second spacers 180', are sacrificial and are removed. For this disclosure, the term "sacrificial" refers to spacers or other layers used in patterning (such as layer 70) which may be removed prior to patterning the layer to be etched.

With the embodiment above providing a CD reduction of 1/2m where m is the number of spacer layers formed, the decrease in pitch is a multiple of 2 (i.e. ½, ¼, ⅙, etc.). The embodiment described below provides a CD reduction of 1/(2m−1) where m≥2, thus the reduction may be ⅓, ⅕, 1/7, etc. of the original pattern.

In this embodiment, the structure of FIG. 7 is formed according to techniques known in the art, and comprises a layer to be etched 72 and a photolithographic pattern comprising photoresist 70 overlying the layer to be etched 72. The layer to be etched may be a semiconductor wafer, one or more layers overlying a semiconductor layer, or one or more other layers which are to be subjected to a patterning etch. In this embodiment, the photolithographic features 70 are formed at the lithographic limits, with the width of each feature 70 and the spacing 14 between the features 70 all being about equal. Layer 70 may comprise a patterned material other than photoresist.

Figure 23:
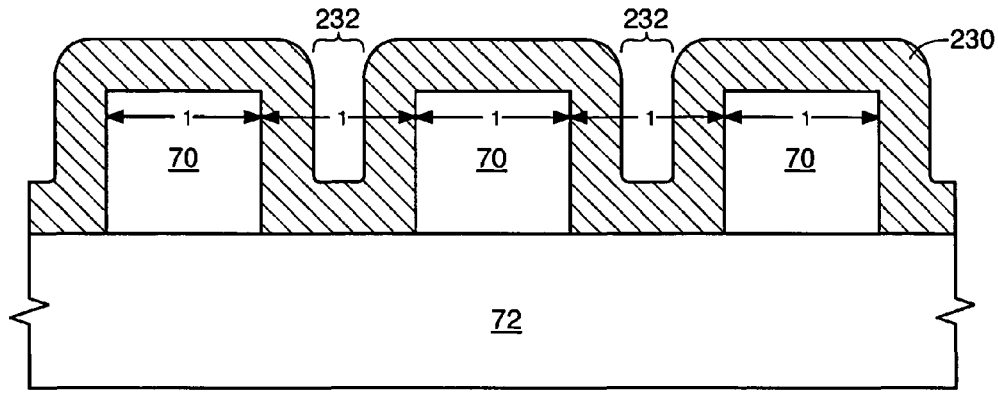
FIGS. 23-31 are cross sections depicting another embodiment and variations of the inventive method which increases the number of features in a given area by three times.

After forming the FIG. 7 structure, a first spacer layer 230, such as silicon dioxide, is deposited over the surface of the FIG. 7 structure to result in the structure of FIG. 23. The thickness of first spacer layer 230 is targeted to be ⅓ times the width of photoresist 70. A spacer etch is performed on first spacer layer 230 of FIG. 23, then the photoresist layer 70 is removed, which results in the FIG. 24 structure having spacers 230'. As the spacer etch and photoresist etch removes very little or none of the vertical portions of the first spacer layer 230, the spacing at 232 and 240 does not change significantly. Spacing 240 equals the width of the photoresist layer 70 depicted in FIG. 23.

Figure 24:
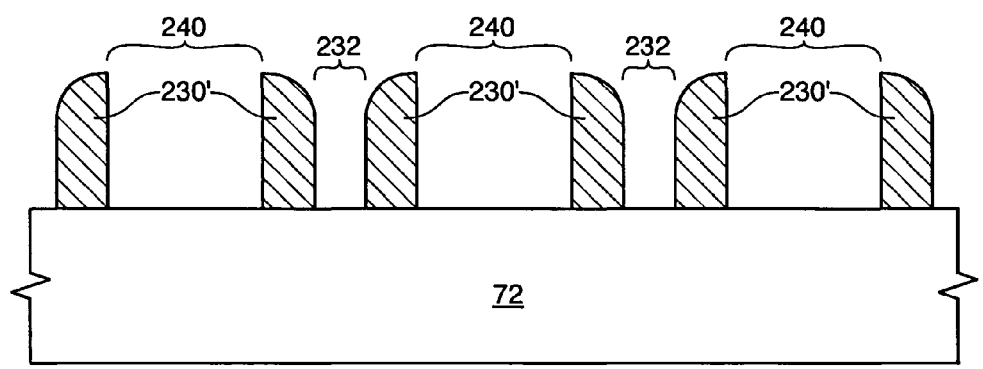
Figure 25:
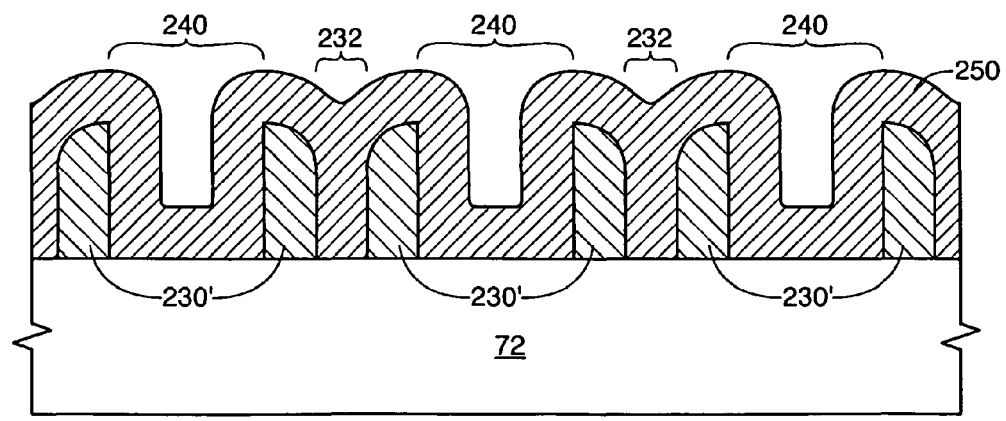

Next, a second spacer layer 250 is formed over the FIG. 24 structure to result in the FIG. 25 structure. The material of second spacer layer 250 is selected such that first spacers 230' may be removed selective to layer 250. In this embodiment, second spacer layer 250 comprises silicon nitride. This layer 250 is also targeted to a thickness equal to ⅓ times the thickness of photoresist layer 70 depicted in FIG. 23. The process thus far results in spacing 232 being about ⅓ the width of photoresist layer 70 depicted in FIG. 23. Because layer 250 is formed to have a thickness (equal ⅓) which is more than ½ the distance of 232 (equal to ⅓), layer 250 bridges across the openings at 232, but does not bridge across the openings at 240.

Figure 26:
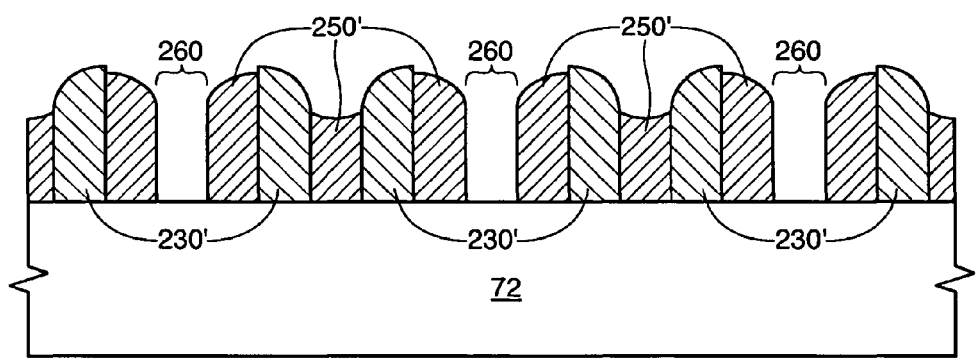

After forming the FIG. 25 structure, an etch such as a spacer etch is performed on the second spacer layer 250 to result in the structure of FIG. 26 comprising spacers 230' and 250'. This etch exposes the layer to be etched 72, but only at locations 260 over which photoresist layer 70 was originally formed. Further, locations 260 are each only about ⅓ the width of the photoresist layer 70 at FIG. 23.

Figure 27:
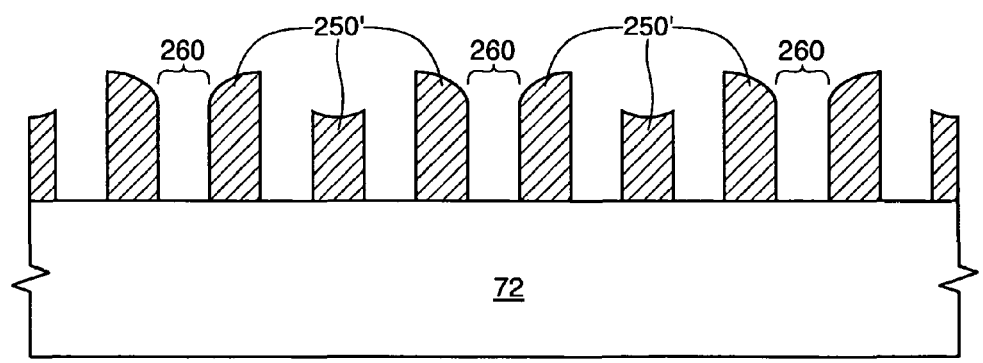

After forming the FIG. 26 structure, the first spacers 230' are etched selective to the second spacers 250' to result in the structure of FIG. 27. In this embodiment, the pattern formed by remaining second spacer layer 250 has a density which is three times that of layer 70 at FIG. 23 (i.e. the pitch is ⅓ times that of the pitch of features 70 at FIG. 23). The particular etch used to remove the first spacers 230' selective to the second spacers 250' depends on the material used for each layer, and may be any suitable etch known in the art. Finally, layer to be etched 72 is etched using any etchant which removes layer 72 (removal not depicted) with reasonable selectivity to spacers 250'.

Figure 28:
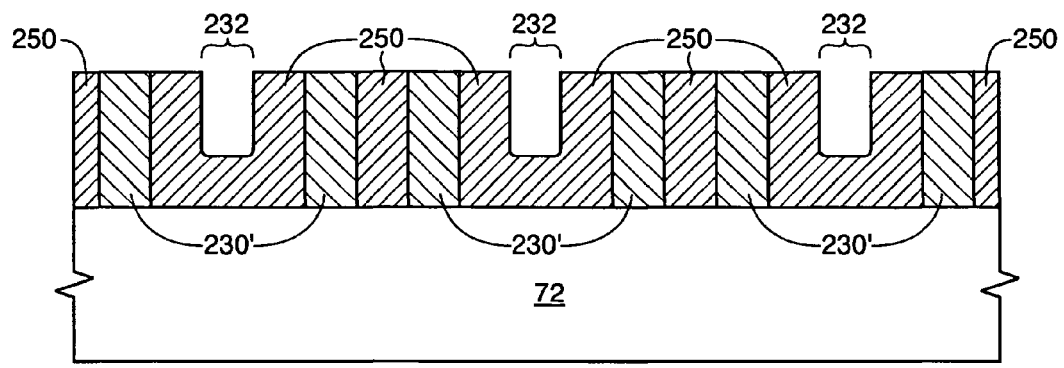
Figure 29:
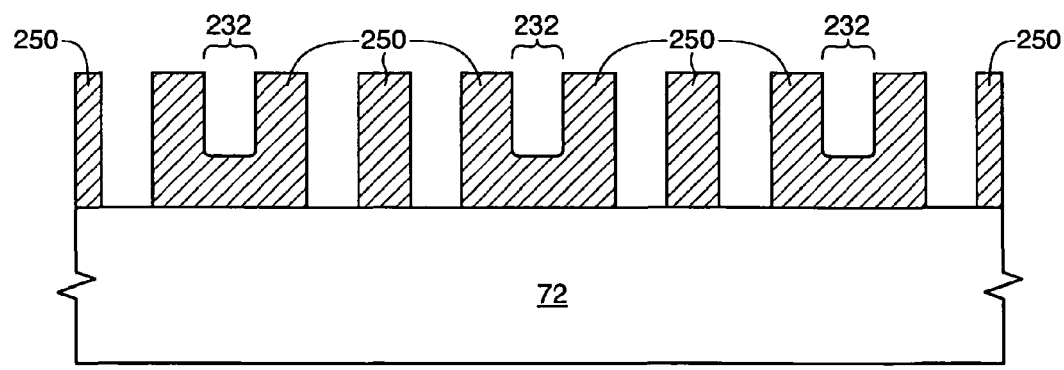
Figure 30:
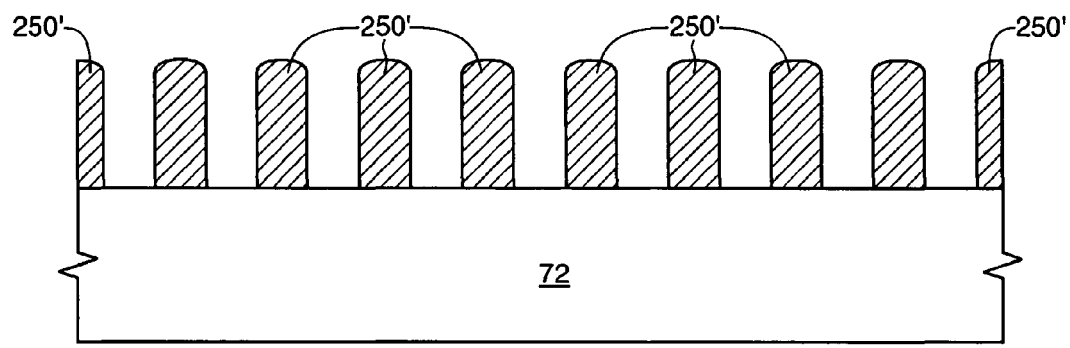
Figure 31:
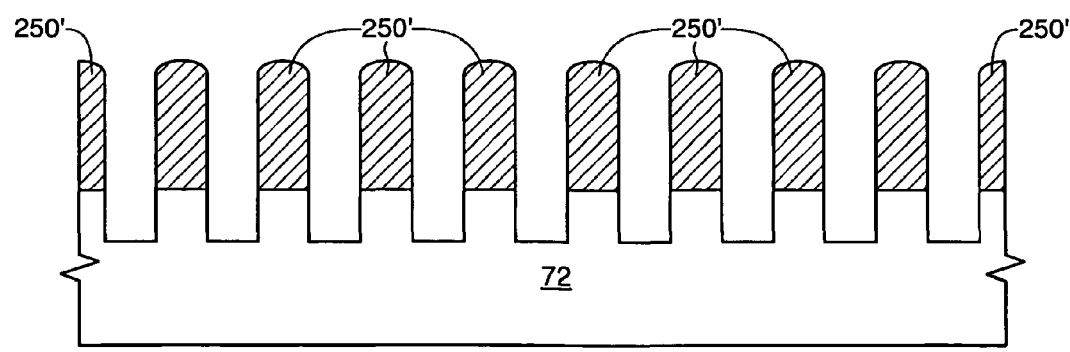

Instead of performing a spacer etch on the FIG. 25 structure to result in the FIG. 26 structure, a planarization process such as CMP process may be performed on the FIG. 25 structure to result in the structure of FIG. 28. Spacers 230' are then removed to leave the pattern of FIG. 29, then an etch back (spacer etch) of spacer layer 250 is performed to result in the FIG. 30 structure comprising spacers 250'. Finally, layer 72 is etched to result in the structure of FIG. 31. This CMP process may result in spacers 250' comprising a more uniform height than using a spacer etch, which may be advantageous to subsequent processing. As a spacer etch is performed on the FIG. 29 structure to clear the horizontal portions of layer 250 which connect adjacent spacers, all of features 250' depicted by FIG. 30 are spacers, and comprise planarized, coplanar tops.

In an alternate embodiment to the previous paragraph, an etch back of layer 250 of FIG. 28 may be performed first, then spacers 230' may be removed.

The process of FIGS. 23-27 provides a CD reduction of 1/(2m-1) where m=2 (comprising spacer layers 230 and 250); thus the pitch reduction is ⅓ (three times the feature density). This process may be modified for any practical value of m, thus the reduction may be ⅓, ⅕, ⅐, etc. of the original pattern. A process is depicted below where m=3, thus the pitch will be ⅕ of the original mask (i.e. five times the feature density). Again, for simplicity of explanation, the width of the photoresist is initially targeted to an arbitrary thickness of 1, with a distance between the photoresist of 1. The photoresist features, therefore, have a pitch of 2, which is depicted in FIG. 7. As with the embodiment of FIGS. 23-27, the photoresist is not trimmed in this embodiment.

Figure 32:
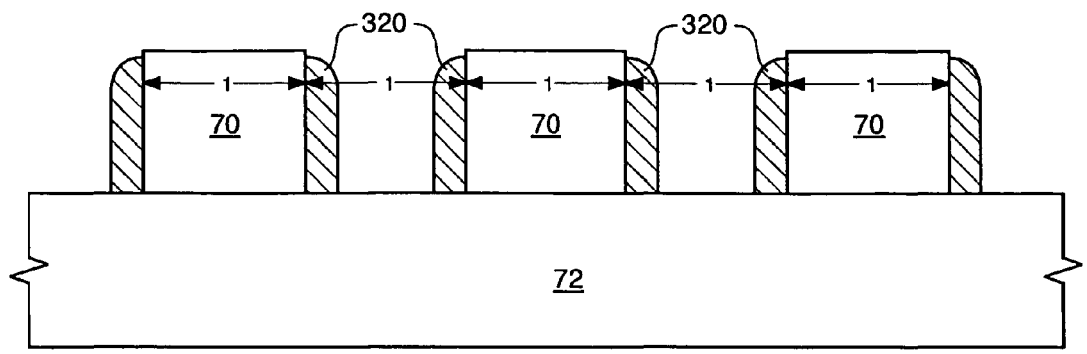
FIGS. 32-38 are cross sections depicting another embodiment of the invention which increases the number of features in a given area by five times.

For this embodiment, a blanket spacer layer, for example silicon nitride, is formed over the FIG. 7 structure. The blanket spacer layer is targeted to have a thickness of ⅕ the width of each photoresist feature 70. A spacer etch is performed on the first spacer layer to leave the structure of FIG. 32 having first spacers 320, photoresist 70, and the layer to be etched 72. At this point, m=1, with spacers 320 being formed from the first spacer layer.

Figure 33:
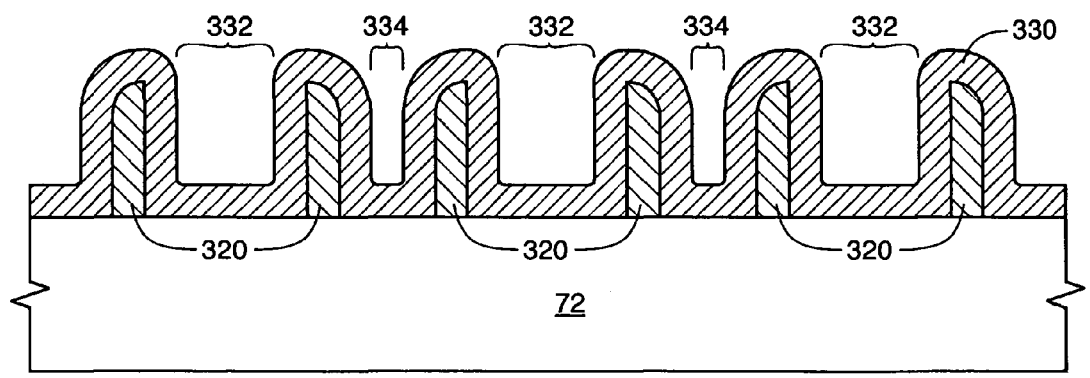
Figure 34:
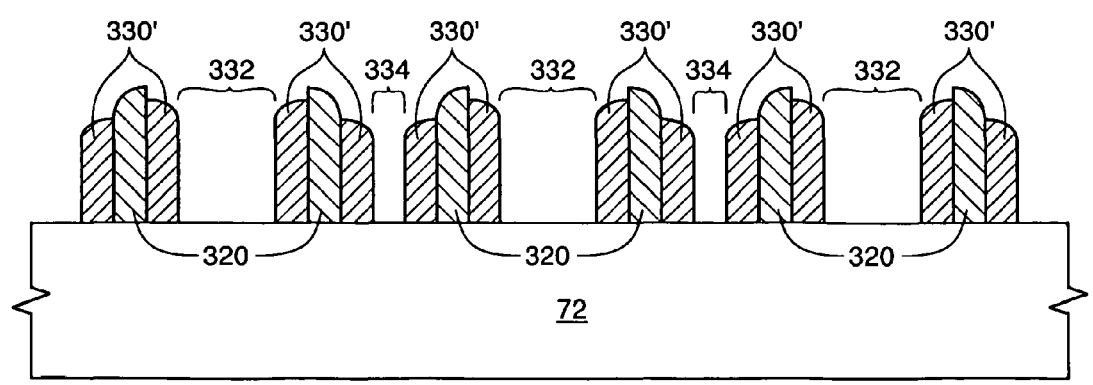

Photoresist layer 70 is removed and a second spacer layer 330 is formed over the first spacers 320 as depicted in FIG. 33. Layer 330 comprises a material which may be etched selective to the material of spacers 320, for example silicon dioxide. Layer 330 is targeted to a thickness of ⅕, thus the spacing at 332 is ⅗ and the spacing at 334 is ⅕. A spacer etch is performed to result in the structure of FIG. 34 having first spacers 320 and second spacers 330'; thus m=2 at this point in the process, with spacers 330' being formed from the second spacer layer 320.

Next, a third spacer layer 350 is formed. Third spacer layer 350 may comprise the same material of the first spacer layer, in this embodiment silicon nitride, or a different material which will withstand an etch of the second spacer layer. The third spacer layer is targeted to a thickness of ⅕. Because the target thickness of the third spacer layer 350 is more than half the spacing at 334, layer 350 bridges across opening 334, but forms conformally at spacing 332, which has a distance of ⅗. As there have been three spacer layers used to this point in the process, m=3.

Figure 35:
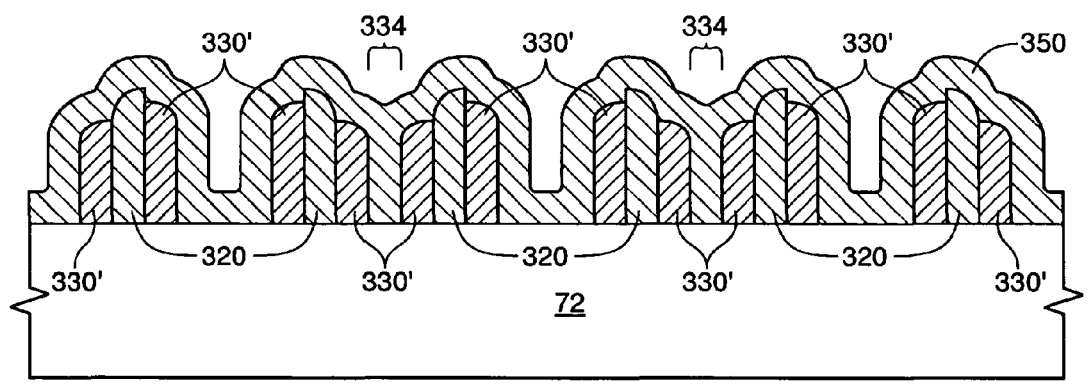
Figure 36:
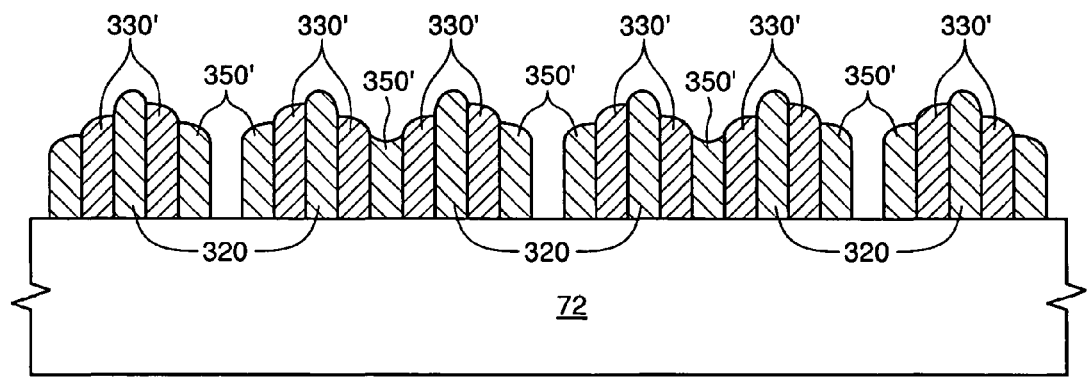

After completing the FIG. 35 structure, a spacer etch is performed on the third spacer layer 350 to result in the structure of FIG. 36 having third spacers 350'.

Figure 37:
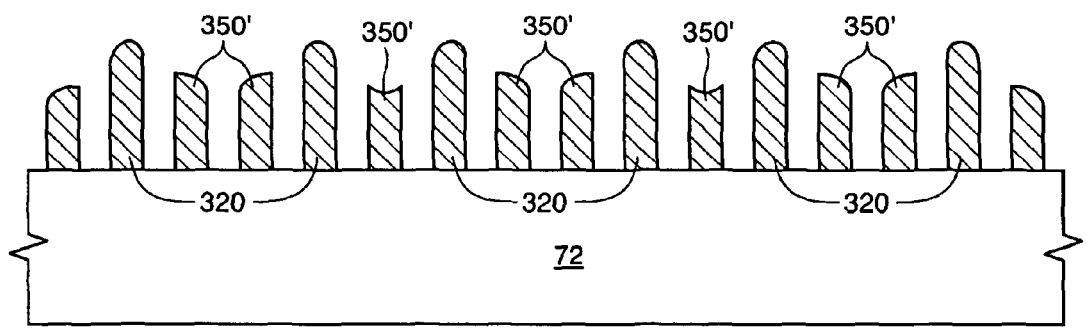
Figure 38:
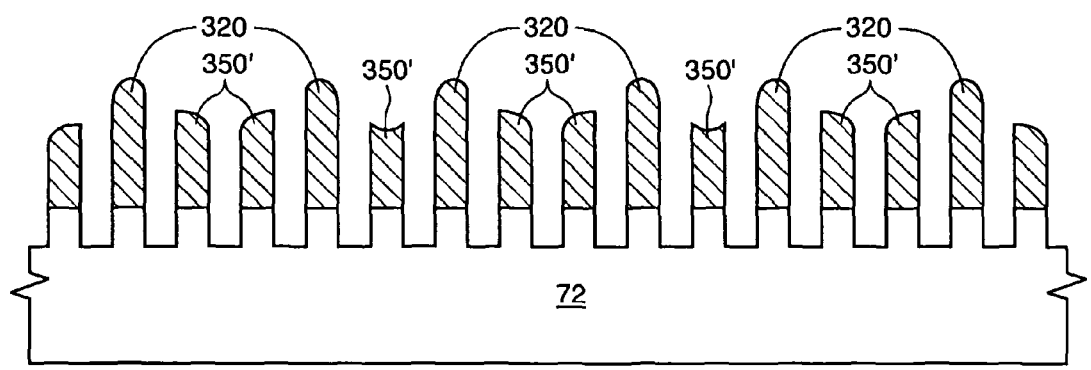

Subsequently, the second spacers 330' are etched selective to first spacers 320 and third spacers 350' to result in the FIG. 37 structure. The remaining spacers 320, 350 are then used as a mask to etch the layer to be etched 72 to result in the structure of FIG. 38. Finally, spacers 320, 350' may be removed.

In the alternative to using spacer etches, a planarization, for example CMP, may be performed on structures of the various embodiments. This CMP process may result in each of the spacers having a uniform height, which may be advantageous to subsequent processing. Using a planarizing process rather than a spacer etch to remove a portion of the spacer layer may be advantageous when using higher values of m. Rather than having the profile of FIG. 38 which is formed using spacer etches, a structure formed using a planarizing process will have a profile similar to FIG. 31. It is also contemplated that one or more spacer etches may be combined with one or more planarizing processes.

As with the embodiments depicted in FIGS. 7-22, the sizes of various elements related to the pattern formed by the embodiments of FIGS. 23-38 may be described in mathematical terms. The CD is reduced to 1/(2m-1) of its original value, where the original value of the CD is the width of photoresist feature 70 at FIGS. 23 and 32, and m is the number of spacer layers which are formed, where m≥2. The equation 1+X+2ma=-a may be used to determine the number of spacer layers required for a given reduction in CD, where m≥2 and "a" is the thickness of the spacer layers divided by the width of the original photoresist layer. In this embodiment, X=0 as there is no trim.

While the original mask layer 70 is trimmed in the embodiments of FIGS. 7-22 and untrimmed in the embodiments of FIGS. 23-38, the two processes have similarities. For example, it is possible (but not required) to form all the spacers from only two different types of materials. The m, m-2, m-4, etc. spacer layers may all be formed from the same material, while the m-1, m-3, m-5, etc. layers may also be formed from the same material (but different than, and etchable selective to, the m, m-2, m-4, etc. layers). Each spacer layer is formed from a different material than the preceding spacer. Further, the original masking layer, layer 70 in both embodiments, is removed prior to forming the second spacer layer. Also, with either embodiment the m-1, m-3, m-5, etc. spacer layers may be removed, while the m, m-2, m-4, etc. spacer layers may be used as a pattern.

The embodiments of FIGS. 7-22 provide a feature density multiplier which is an even number, while the embodiments of FIGS. 23-38 provide a feature density multiplier which is an odd number. The embodiments of FIGS. 7-22 have no bridging of the spacer layers, while the embodiments of FIGS. 23-38 both have an instance of bridging of a spacer layer (at 232 of FIG. 25 and at 334 of FIG. 35).

In yet another embodiment, the structure of FIG. 14 is formed, and layer 120 is used in place of photoresist layer 70 of FIG. 7. Thus layer 120 is trimmed, and a spacer layer is formed and spacer etched, then layer 120 is removed, as is done in FIGS. 8-11. The process continues with the second spacer layer of FIGS. 12 and 13.

In another embodiment, the structure of FIG. 27 is formed, and layer 250 is used in place of photoresist layer 70 of FIG. 7. Thus a spacer layer is formed over layer 250, then layer 250 is removed as is done to layer 70 in FIG. 24 and this final spacer layer is used as a mask to etch layer 10. A similar process may be performed with other embodiments disclosed herein.

Figure 39:
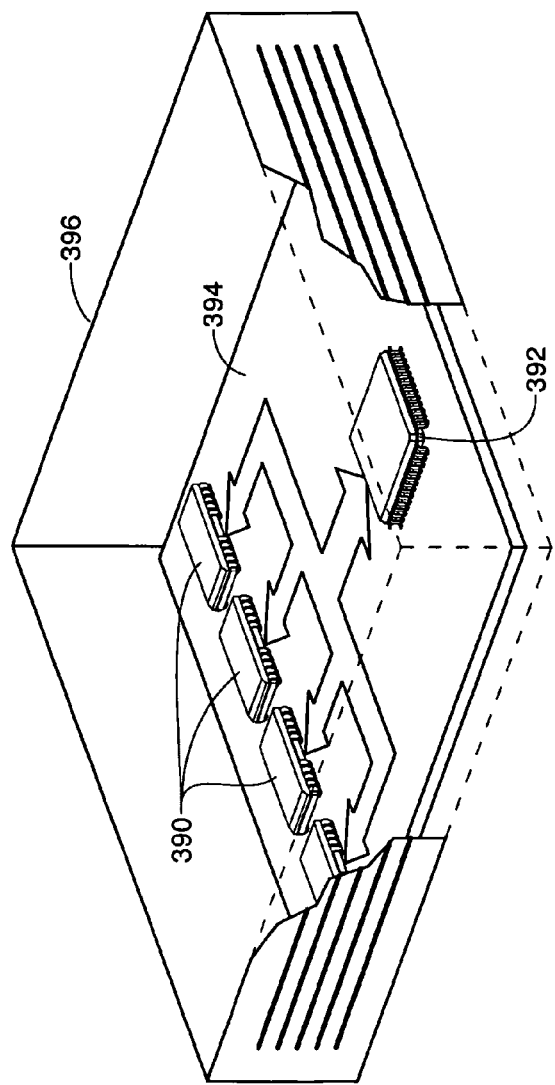
FIG. 39 is an isometric depiction of various components which may be manufactured using devices formed with an embodiment of the present invention.

As depicted in FIG. 39, a semiconductor device 390 formed in accordance with the invention may be attached along with other devices such as a microprocessor 392 to a printed circuit board 394, for example to a computer motherboard or as a part of a memory module used in a personal computer, a minicomputer, or a mainframe 396. The microprocessor and/or memory devices may be formed with (or otherwise comprise) an embodiment of the present invention. FIG. 39 may also represent use of device 390 in other electronic devices comprising a housing 396, for example devices comprising a microprocessor 392, related to telecommunications, the automobile industry, semiconductor test and manufacturing equipment, consumer electronics, or virtually any piece of consumer or industrial electronic equipment.

Figure 40:
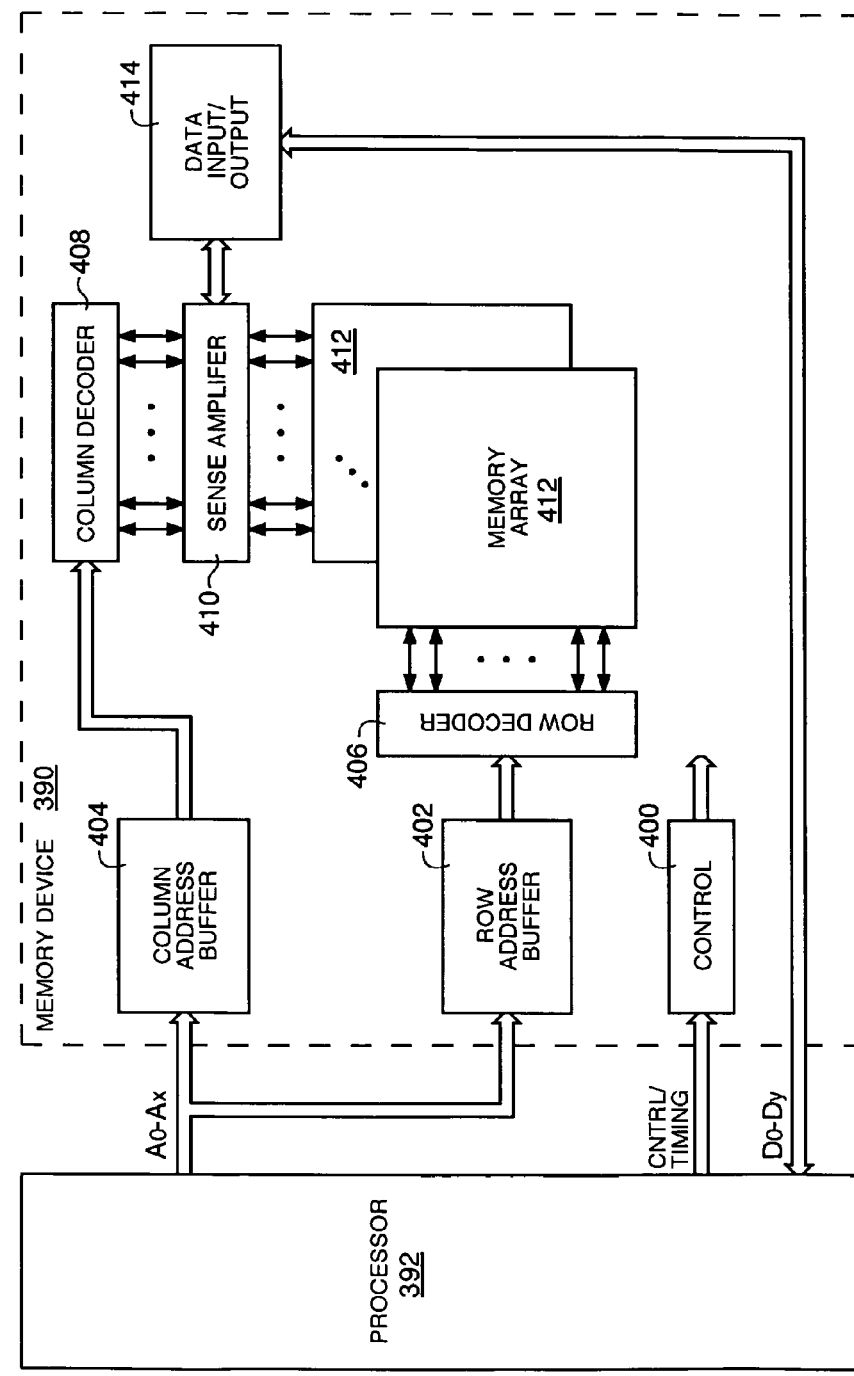
FIG. 40 is a block diagram of an exemplary use of the invention to form part of a memory device having a storage transistor array.

The processes and structures described herein may be used to manufacture a number of different structures comprising a patterned layer formed according to the inventive process. FIG. 40, for example, is a simplified block diagram of a memory device such as a dynamic random access memory having container capacitors, transistor gates, and other features which may be formed using an embodiment of the present invention. The general operation of such a device is known to one skilled in the art. FIG. 40 depicts a processor 392 coupled to a memory device 390, and further depicts the following basic sections of a memory integrated circuit: control circuitry 400; row address buffer 402; column address buffer 404; row decoder 406; column decoder 408; sense amplifier 410; memory array 412; and data input/output 414.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the structures described as being formed from photoresist may be formed from other materials such as amorphous carbon (AC), transparent carbon (TC), multilayer resist (MLR), or bilayer resist (BLR). A dry development etch may be performed to transfer a pattern from a photoresist layer to a dielectric anti-reflective coating (DARC), or to a bottom anti-reflective coating (BARC), then to amorphous carbon, transparent carbon, an underlying multilayer resist, or to an underlayer of multilayer resist or bilayer resist. Further, a trim, if employed, may be performed on photoresist prior to the dry development etch or on an underlying layer after the dry development etch.

The spacer thickness in various embodiments is assumed to be equal to the target CD. The result is that the lines and spaces have equal widths. However, the spacer thickness of the two types of spacer materials may be different so that a final pattern with various duty cycles may be formed, as long as the sum of the two spacer thickness is equal to the final pitch. For example, during the pitch triple reduction process, a thick first spacer may be used with a thin second spacer. After the first spacer is selectively removed, the final pattern of relaxed pitch (i.e. the line smaller than the spacer) is formed with a density of three times the original density. This may be preferred in some embodiments, for example when used with a shallow trench isolation process. It is, therefore, contemplated that the appended claims will cover any such modifications or embodiments as fall within the true scope of the invention.

The invention claimed is:

1. An in process semiconductor device, comprising:
an etch mask above a layer to be etched, the etch mask comprising a plurality of triads of spacers on the outermost surface of the layer to be etched, the triads comprising the first spacer bracketed by second spacers on the surface with each of the spacers within the triad having a different elevational thickness and the second spacers contacting the first spacer, wherein the first spacer has an elevational thickness greater than either of the bracketing second spacers.

2. The in process semiconductor device of claim 1 wherein at least one of the spacers comprises silicon nitride.

3. The in process semiconductor device of claim 1 wherein each of the spacers are formed from one of two different types of materials.

4. The in process semiconductor device of claim 1 wherein the at least two spacers are adjacent spacers comprising different materials.

5. An in process semiconductor device comprising:
an etch mask above a layer to be etched, the etch mask comprising a plurality of groups of five adjacent spacers of the layer to be etched, each group comprising triads of spacers on the outermost surface, the triads comprising the first spacer bracketed by second spacers on the surface with each of the spacers within the triad having a different elevational thickness and the second spacers contacting the first spacer, wherein the first spacer has an elevational thickness greater than either of the bracketing second spacers.

6. The in process semiconductor device of claim 5 wherein all of the spacers are non-planar.

7. The in process semiconductor device of claim 5 wherein at least one of the spacers comprise silicon nitride.

8. The in process semiconductor device of claim 5 wherein each spacer within the group of five spacers has a different elevational thickness.

9. The in process semiconductor device of claim 5 wherein the groups of five spacers are spaced apart from one another.

10. The in process semiconductor device of claim 5 wherein individual spacers within the groups of five spacers contact one another.

* * * * *